United States Patent
Zhang et al.

(10) Patent No.: US 10,180,601 B2
(45) Date of Patent: Jan. 15, 2019

(54) LIQUID CRYSTAL DISPLAY PANEL AND LIQUID CRYSTAL DISPLAY APPARATUS

(71) Applicant: Wuhan China Star Optoelectronics Technology Co., Ltd., Wuhan, Hubei (CN)

(72) Inventors: Qipei Zhang, Guangdong (CN); Caiqin Chen, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 157 days.

(21) Appl. No.: 15/128,398

(22) PCT Filed: Sep. 6, 2016

(86) PCT No.: PCT/CN2016/098172
§ 371 (c)(1),
(2) Date: Sep. 22, 2016

(87) PCT Pub. No.: WO2018/032551
PCT Pub. Date: Feb. 22, 2018

(65) Prior Publication Data
US 2018/0180920 A1   Jun. 28, 2018

(30) Foreign Application Priority Data
Aug. 19, 2016 (CN) .......................... 2016 1 0695291

(51) Int. Cl.
*G02F 1/1333* (2006.01)
*G02F 1/1339* (2006.01)
(Continued)

(52) U.S. Cl.
CPC ........ *G02F 1/13394* (2013.01); *G02F 1/1339* (2013.01); *G02F 1/1368* (2013.01);
(Continued)

(58) Field of Classification Search
CPC ......... G02F 1/133514; G02F 1/133516; G02F 2001/136222; G02F 2201/52;
(Continued)

(56) References Cited

U.S. PATENT DOCUMENTS 5,917,572 A * 6/1999 Kurauchi ............ G02F 1/13394
349/156
2005/0225575 A1* 10/2005 Brown Elliott ... G02F 1/133514
345/694
(Continued)

FOREIGN PATENT DOCUMENTS

CN   102955297 A   3/2013
CN   104880865 A   9/2015
KR   101192761 B1  10/2012

*Primary Examiner* — Jia Pan
(74) *Attorney, Agent, or Firm* — Andrew C. Cheng

(57) ABSTRACT

The present application discloses a liquid crystal display panel and a liquid crystal display apparatus. The liquid crystal display panel includes a color filter substrate, and an array substrate, formed opposite and space apart from the color filter substrate, and a photo spacer disposed between the color filter substrate and the array substrate, a side of the array substrate toward the color filter substrate is set up a contact hole, a side of the color filter substrate toward the array substrate is disposed a projection, the height of the projection is larger than the height of the photo spacer, and the top of the projection is inserted into the contact hole.

9 Claims, 3 Drawing Sheets

(51) Int. Cl.
*G06F 3/041* (2006.01)
*G02F 1/1335* (2006.01)
*G02F 1/1362* (2006.01)
*G02F 1/1368* (2006.01)
*G06F 3/044* (2006.01)
*G09G 3/36* (2006.01)
*H01L 27/12* (2006.01)

(52) U.S. Cl.
CPC .... *G02F 1/13338* (2013.01); *G02F 1/133512* (2013.01); *G02F 1/133516* (2013.01); *G02F 1/136227* (2013.01); *G06F 3/041* (2013.01); *G06F 3/044* (2013.01); *G06F 3/0412* (2013.01); *G09G 3/36* (2013.01); *G02F 1/136286* (2013.01); *G02F 2001/133357* (2013.01); *G02F 2001/133519* (2013.01); *G02F 2201/121* (2013.01); *G06F 2203/04103* (2013.01); *H01L 27/124* (2013.01); *H01L 27/1248* (2013.01)

(58) Field of Classification Search
CPC ............ G02F 1/13394; G02F 1/13338; G02F 1/136227; G02F 1/133512; G02F 1/1339; G02F 1/13392; G02F 2001/13396; G02F 1/136286; G09G 3/2003; G09G 2300/0452; G09G 2300/0443; G09G 3/3607; G09G 3/3611; G09G 5/02; G02B 5/201; H01L 27/322; H01L 27/3213; H01L 27/3218; H01L 27/3211; G06F 3/041; G06F 3/044

See application file for complete search history.

(56) References Cited

U.S. PATENT DOCUMENTS

| | | | |
|---|---|---|---|
| 2007/0002264 A1* | 1/2007 | Kim | G02F 1/13394 349/156 |
| 2007/0247584 A1 | 10/2007 | Li et al. | |
| 2009/0079927 A1* | 3/2009 | Yamamoto | G02F 1/13394 349/155 |
| 2009/0231522 A1 | 9/2009 | Kim et al. | |
| 2010/0328239 A1* | 12/2010 | Harada | G06F 3/0412 345/173 |
| 2012/0081641 A1 | 4/2012 | Noh et al. | |
| 2012/0320326 A1* | 12/2012 | Doi | G02F 1/13338 349/147 |
| 2013/0021552 A1* | 1/2013 | Tomioka | G02F 1/13392 349/43 |
| 2013/0162570 A1* | 6/2013 | Shin | G06F 3/041 345/173 |
| 2013/0257794 A1* | 10/2013 | Lee | G06F 3/041 345/174 |
| 2016/0253023 A1* | 9/2016 | Aoyama | G06F 3/0416 345/174 |
| 2017/0017338 A1* | 1/2017 | Tsai | G06F 3/0416 |

* cited by examiner

LIQUID CRYSTAL DISPLAY PANEL AND LIQUID CRYSTAL DISPLAY APPARATUS

FIELD OF THE INVENTION

The present application relates to a liquid crystal display technology field, and more particularly to a liquid crystal display panel and liquid crystal display apparatus.

BACKGROUND OF THE INVENTION

In the Liquid Crystal Display, LCD structure design, a photo spacer, PS is for controlling thickness and uniformity of the liquid crystal cell between the array substrate and the color filter substrate. Currently, in order to ensure the aperture ratio, as illustrated in FIG. 1, each of the photo spacer 11 is typically disposed within the two adjacent thin film transistors, TFT 12 in the industry (Thin-film transistor, referred to as TFT) 12, specifically located between the two contact holes 13 formed in the array substrate 10. The contact hole 13 is also known as planarization layer, PLN hole, which opened on the planarization layer 14 of the array substrate 10, a pixel electrodes 15 is formed in the contact hole 13 and the pixel electrode 15 is electrically connected to the drain electrode of the thin film transistor 12 through the contact hole 13. However, with the increasing pixels per inch, PPI (the number of pixels or pixel density) of the LCD, the distance of the photo spacer 11 and the contact hole 13 is getting smaller and smaller, the photo spacer 11 is easily slide into the contact hole 13 by an external force, resulting in the poor stability of the photo spacer 11, so that the thickness and uniformity of the liquid crystal cell is difficult to be guaranteed. In addition, it is easily to damage the active area, AA of the LCD during the slide process of the photo spacer 11 into the contact hole 13.

SUMMARY OF THE INVENTION

In view of this, the present application provides a liquid crystal display panel and liquid crystal display apparatus to prevent a photo spacer into the display area due to the shift, improve the stability of the photo spacer and to avoid damage to the display area.

The embodiment of the present application provides a liquid crystal display panel includes a color filter substrate, and an array substrate, formed opposite and space apart from the color filter substrate, and a photo spacer disposed between the color filter substrate and the array substrate, a side of the array substrate toward the color filter substrate is set up a contact hole, a side of the color filter substrate toward the array substrate is disposed a projection, the height of the projection is larger than the height of the photo spacer, and the top of the projection is inserted into the contact hole;

Wherein the color filter substrate including a first substrate body, a color filter layer and an over coat layer, the color filter layer is formed on a side of the first substrate body toward the array substrate, the over coat layer is formed on a side of the color filter layer toward the array substrate, the projection is formed by at least one of the multiple exposure and development in the formation of the color filter layer; the array substrate including a second substrate body and a thin film transistor, a planarization layer and a pixel electrode layer formed on the second substrate body, the pixel electrode layer is formed in the contact hole, and is electrically connected to the drain electrode of the thin film transistor through the contact hole.

Wherein the array substrate further including a common electrode layer and a passivation layer located below the photo spacer, the passivation layer is located between the common electrode layer and the photo spacer, the photo spacer is in contact with the passivation layer.

Wherein the array substrate further including a passivation layer, a touch electrode, a dielectric spacer layer, and a common electrode subsequently formed below the photo spacer, and the photo spacer is in contact with the passivation layer.

The embodiment of the present application provides a liquid crystal display panel includes a color filter substrate, and an array substrate, formed opposite and space apart from the color filter substrate, and a photo spacer disposed between the color filter substrate and the array substrate, a side of the array substrate toward the color filter substrate is set up a contact hole, a side of the color filter substrate toward the array substrate is disposed a projection, the height of the projection is larger than the height of the photo spacer, and the top of the projection is inserted into the contact hole.

Wherein the color filter substrate further including a first substrate body and a color filter layer, the color filter layer is formed on a side of the first substrate body toward the array substrate, the projection is formed by at least one of the multiple exposure and development in the formation of the color filter layer.

Wherein the color filter substrate further including a first substrate body, a color filter layer and an over coat layer, the color filter layer is formed on a side of the first substrate body toward the array substrate, the over coat layer is formed on a side of the color filter layer toward the array substrate, the projection is formed by at least one of the multiple exposure and development in the formation of the color filter layer.

Wherein the color filter substrate further including a black matrix disposed between the first substrate body and the color filter layer.

Wherein the color filter layer including a red color filter, a green color filter and a blue color filter.

Wherein the color filter layer including a red color filter, a green color filter, a blue color filter and a white color filter.

Wherein the array substrate further including a second substrate body and a thin film transistor, a planarization layer and a pixel electrode layer formed on the second substrate body, the contact hole is set up in the planarization layer, the pixel electrode layer is formed in the contact hole, and is electrically connected to the drain electrode of the thin film transistor through the contact hole.

Wherein the array substrate further including a common electrode layer and a passivation layer located below the photo spacer, the passivation layer is located between the common electrode layer and the photo spacer, the photo spacer is in contact with the passivation layer.

Wherein the array substrate further including a passivation layer, a touch electrode, a dielectric spacer layer, and a common electrode subsequently formed below the photo spacer, and the photo spacer is in contact with the passivation layer.

The embodiment of the present application provides a liquid crystal display apparatus includes a liquid crystal display panel and a light source module for providing light to the liquid crystal display panel, the liquid crystal display panel including: a color filter substrate, and an array substrate, formed opposite and space apart from the color filter substrate, and a photo spacer disposed between the color filter substrate and the array substrate, a side of the array substrate toward the color filter substrate is set up a contact hole, a side of the color filter substrate toward the array substrate is disposed a projection, the height of the projection is larger than the height of the photo spacer, and the top of the projection is inserted into the contact hole.

Wherein the color filter substrate further including a first substrate body and a color filter layer, the color filter layer is formed on a side of the first substrate body toward the array substrate, the projection is formed by at least one of the multiple exposure and development in the formation of the color filter layer.

Wherein the color filter substrate further including a first substrate body, a color filter layer and an over coat layer, the color filter layer is formed on a side of the first substrate body toward the array substrate, the over coat layer is formed on a side of the color filter layer toward the array substrate, the projection is formed by at least one of the multiple exposure and development in the formation of the color filter layer.

Wherein the color filter substrate further including a black matrix disposed between the first substrate body and the color filter layer.

Wherein the color filter layer including a red color filter, a green color filter and a blue color filter or the color filter layer including a red color filter, a green color filter, a blue color filter and a white color filter.

Wherein the array substrate further including a second substrate body and a thin film transistor, a planarization layer and a pixel electrode layer formed on the second substrate body, the contact hole is set up in the planarization layer, the pixel electrode layer is formed in the contact hole, and is electrically connected to the drain electrode of the thin film transistor through the contact hole.

Wherein the array substrate further including a common electrode layer and a passivation layer located below the photo spacer, the passivation layer is located between the common electrode layer and the photo spacer, the photo spacer is in contact with the passivation layer.

Wherein the array substrate further including a passivation layer, a touch electrode, a dielectric spacer layer, and a common electrode subsequently formed below the photo spacer, and the photo spacer is in contact with the passivation layer.

The advantage of the present application is the projection in the embodiment of the present application is design to be disposed above the contact hole, the top of the projection is inserted into the contact hole, by the block of the projection and the contact hole, it is possible to avoid the relative movement of the color filter substrate and the array substrate, thereby preventing by movement of the photo spacer to enter the display area of the liquid crystal display panel, to improve the stability of the photo spacer, and to avoid damage to the display area.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts obtained should be considered within the scope of protection of the present application.

Specifically, the terminologies in the embodiments of the present application are merely for describing the purpose of the certain embodiment, but not to limit the invention. Examples and the claims be implemented in the present application requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 2:
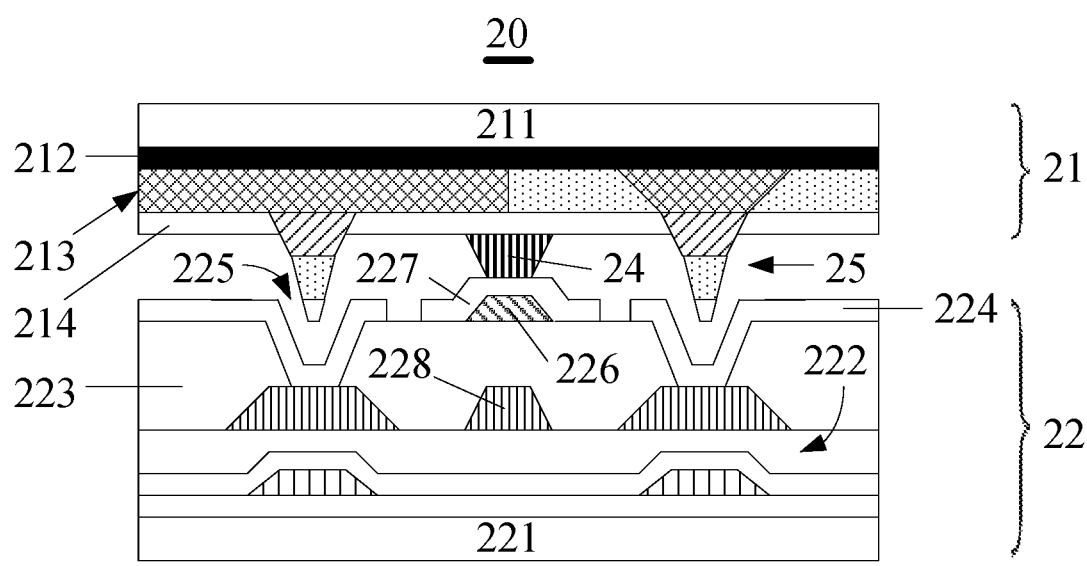
FIG. 2 is a cross-sectional view of a liquid crystal display panel in accordance with one embodiment of the present application.

Referring to FIG. 2, FIG. 2 is a cross-sectional view of a liquid crystal display panel in accordance with one embodiment of the present application. The liquid crystal display panel 20 of the present embodiment includes a color filter substrate, CF substrate 21 and a thin film transistor substrate, TFT substrate 22 formed opposite and space apart from the CF substrate 21 and a liquid crystal (liquid crystal molecules) filled between the two substrates and a photo spacer 24. The liquid crystal is disposed in the liquid crystal cell by stacking and sealing of the color filter substrate 21 and the array substrate 22, the photo spacer 24 is used to control the thickness and uniformity of the liquid crystal cell.

The color filter substrate 21 includes a first substrate body 211, and a black matrix layer 212, a color filter layer (also known as color blocking layer) 213 and an over coat layer, OC 214 sequentially formed on the first substrate body 211. Specifically, the black matrix layer 212 is disposed between the first substrate body 211 and the color filter layer 213, the color filter layer 213 is formed on the black matrix layer 212 toward the side of the array substrate 22, the over coat layer 214 is formed on the color filter layer 213 toward the side of the array substrate 22.

The array substrate 22 includes a second substrate body 221 and a thin film transistor 222, a planarization layer 223 and a pixel electrode layer 224 formed on the second substrate body 221. Specifically, the planarization layer 223 has an open for contact hole 225, the pixel electrode layer 224 formed in the contact hole 225, and the pixel electrode 224 is electrically connected to the drain electrode of the thin film transistor 222 through the contact hole 225.

It should be noted, the color filter substrate 21 and the array substrate 22 mentioned above also includes other structures, such as a polarizer, a common electrode layer 226 and a passivation layer, PV 227, etc., wherein the common electrode layer 226 and the passivation layer 227 is located below the photo spacer 24 and above the data lines 228 of the liquid crystal display panel 20, the passivation layer 227 is located between the common electrode layer 226 and the photo spacer 24, the photo spacer 24 is in contact with the passivation layer 227, and is not all shown in the drawings in the embodiments of the present application.

Figure 1:
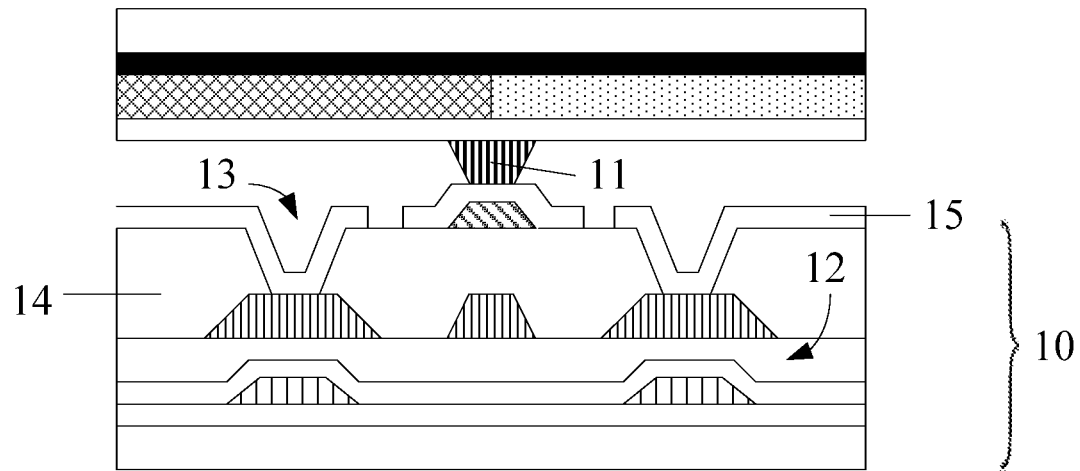
FIG. 1 is a cross-sectional view of a liquid crystal display panel in accordance with one embodiment of the conventional technology.

The difference with the liquid crystal display panel 10 in the conventional technology, illustrated in FIG. 1, combination with illustrated in FIG. 2, a projection 25 is disposed on the color filter substrate 21 toward the side of the array substrate 22. By the block of the projection 25 and the contact hole 225, it is possible to avoid the relative movement of the color filter substrate 21 and the array substrate 22, thereby preventing by movement of the photo spacer 24 to enter the display area of the liquid crystal display panel 20, to improve the stability of the photo spacer 24, and it can try to ensure the thickness and uniformity of the liquid crystal cell, to avoid damage to the display area.

Figure 3:
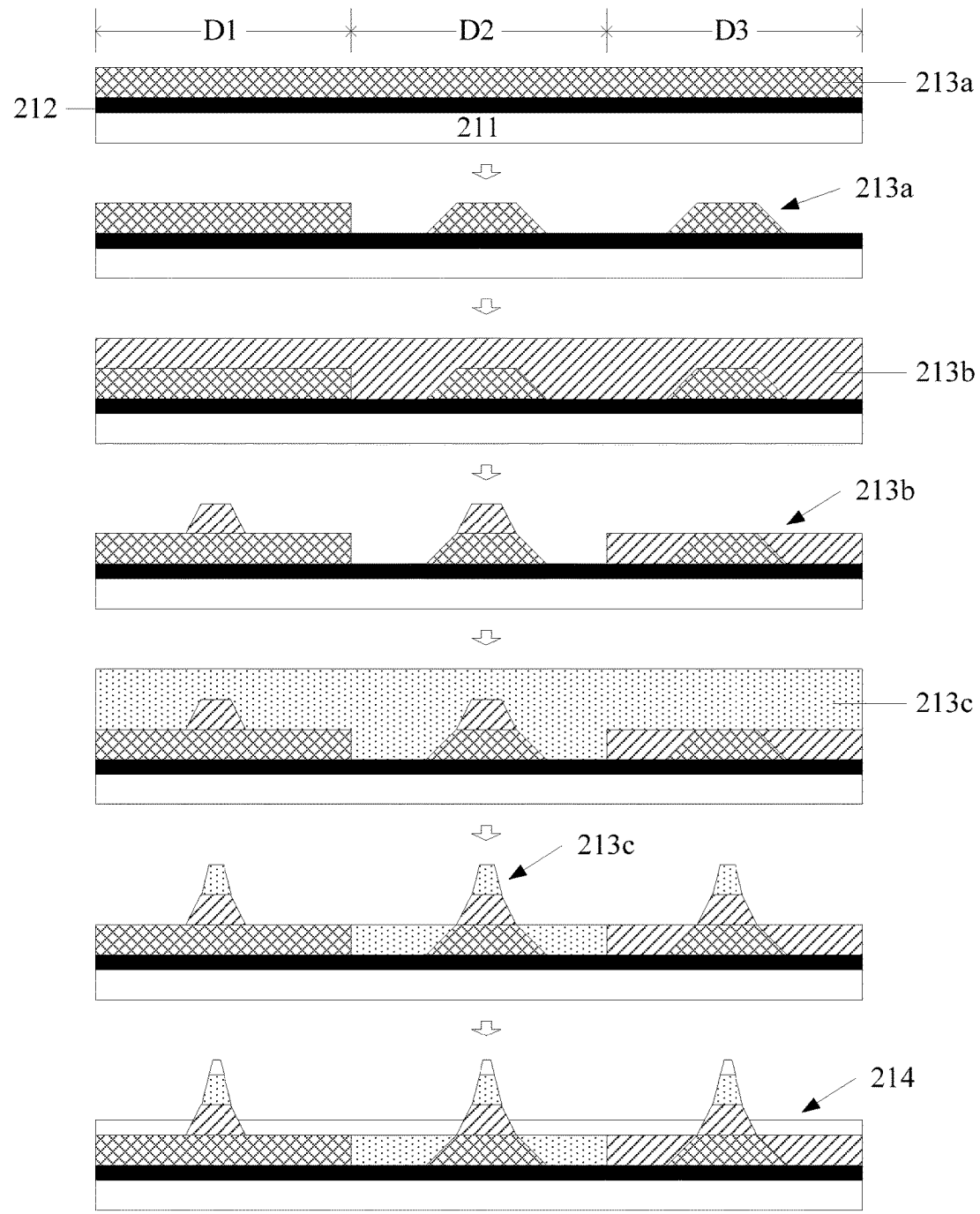
FIG. 3 is a schematic diagram of the formation of projection illustrated in FIG. 2 in accordance with one embodiment.

Following, in combination of FIG. 3 to introduce the manufacturing principles and processes for forming the projection in the embodiment of the present application. First, the first substrate body 211 is provided, and the black matrix layer 212 is formed and covered on the first substrate body 211. Wherein, the first substrate body 211 includes, but not limited to a glass substrate body, a plastic substrate body or a flexible substrate body, and a plurality of spacer regions D1, D2, D3 for disposing color filter is disposed. Specifically, the spacer region D1 is used to set a red color filter, the spacer region D2 is used to set a green color filter, the spacer region D3 is used to set a blue color filter.

Then, a first photoresist 213a is applied on the black matrix layer 212, and a red color filter 213a with predetermined pattern is formed in the spacer regions D1, D2, D3 by performing vacuum drying, removing the edge of the photoresist, pre-baking and cooling, and exposure, development and re-baking to the first substrate body 211 applied with the first photoresist 213a. Wherein the width of the red color filter 213a in the spacer region D2, D3 is smaller than the width of the red color filter 213a in the spacer region D1.

Subsequently, a second photoresist 213b is applied on the black matrix layer 212, and a green color filter 213b with predetermined pattern is formed in the spacer regions D1, D2, D3 by performing vacuum drying, removing the edge of the photoresist, pre-baking and cooling, and exposure, development and re-baking to the first substrate body 211 applied with the second photoresist 213b. Wherein the width of the green color filter 213b in the spacer region D1, D2 is smaller than the width of the green color filter 213b in the spacer region D3.

Further, a third photoresist 213c is applied on the black matrix layer 212, and a blue color filter 213c with predetermined pattern is formed in the spacer regions D1, D2, D3 by performing vacuum drying, removing the edge of the photoresist, pre-baking and cooling, and exposure, development and re-baking to the first substrate body 211 applied with the third photoresist 213c. Wherein the width of the blue color filter 213c in the spacer region D1, D3 is smaller than the width of the blue color filter 213c in the spacer region D2.

Finally, the over coat layer 214 is formed on the color filter layer 213.

In the present embodiment, the sequentially stacked red color filter 213a, the green color filter 213b, the blue color filter 213c and the over coat layer 214 forms the projection 25. That is, the projection 25 is formed by the multiple exposure and development in the formation of the color filter layer 213 and the over coat layer 214. Of course, the projection 25 can be formed by at least one of the multiple exposure and development in the formation of the color filter layer 213 and the over coat layer 214, such as, selecting one or two times from the three of the exposure and development in the formation of the color filter layer 213, and by the use of exposure mask to control the formation of the stacking shape on the black matrix layer 212, and ultimately achieve the purpose of using the stacking of the color filter to form the projection 25.

Of course, in other embodiments, the projection 25 can be formed by at least one of the multiple exposure and development in the formation of the color filter layer 213, for example, the subsequently stacked red color filter 213a, the green color filter 213b and the blue color filter 213c to form the projection 25. And, the sequence to form the color filter layer 213 and the corresponding stacking to form the projection 25 can be changed.

The color filter layer 213 in the above-described embodiments includes the red color filter 213a, the green color filter 213b and the blue color filter 213c as an example, it should be understood that in other embodiments of the present application can also include to form the projection 25 by at least one of the multiple exposure and development in the formation of the color filter layer of red color filter, green color filter, blue color filter and white color filter.

Figure 4:
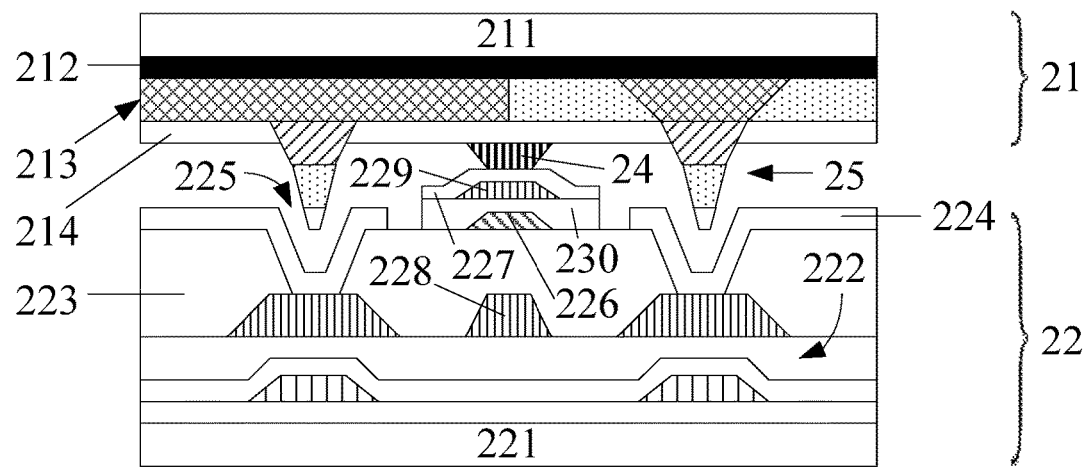
FIG. 4 is a cross-sectional view of a liquid crystal display panel in accordance with another embodiment of the present application.

Referring to FIG. 4, FIG. 4 is a cross-sectional view of a liquid crystal display panel in accordance with another embodiment of the present application. For the same structural elements, the present embodiment employs the same reference numerals embodiment shown in FIG. 2. As shown in FIG. 4, compared to the embodiment shown in FIG. 2, the array substrate 22 in accordance to the present embodiment further includes a touch electrode 229 and a dielectric spacer layer, also known as an Interlayer dielectric isolation, ILD 230, wherein, the passivation layer 227, the touch electrode 229, the dielectric spacer layer 230 and the common electrode layer 226 are formed below the photo spacer 24, the photo spacer 24 is in contact with the passivation layer 227.

In this embodiment, the touch operation can be realized by detecting the change in capacitance caused between the touch electrode 229 and the common electrode layer 226. In view of the touch electrode 229 is disposed inside the liquid crystal display panel, therefore, the present embodiment can be regarded as a liquid crystal display panel adapting the in-cell technology. Accordingly, the embodiment shown in FIG. 2 can be considered as a liquid crystal display panel not adapting the in-cell technology. In summary, an aim of the embodiments of the present application is to dispose a projection on the color filter substrate 21 toward the side of the liquid crystal cell, the projection can be inserted into a corresponding contact hole of the side in the array substrate, by the block of the projection and the contact hole, it is possible to avoid the relative movement of the color filter substrate and the array substrate, thereby preventing by movement of the photo spacer to enter the display area, to improve the stability of the photo spacer, and to avoid damage to the display area. On this basis, the present application can improve the foregoing embodiments, the improved embodiments belong to the scope of patent protection of the present application.

Figure 5:
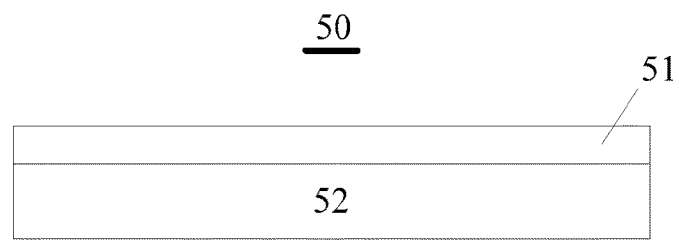
FIG. 5 is a cross-sectional view of a liquid crystal display apparatus in accordance with one embodiment of the present application.

The embodiments of the present application further provides a liquid crystal display apparatus 50 shown in FIG. 5, the liquid crystal display apparatus 50 includes a liquid crystal display panel 51 and a light source module 52 for providing light to the liquid crystal display panel 51, wherein the liquid crystal display panel 51 includes the liquid crystal panels in the embodiments shown in FIGS. 2 and 3. Since the liquid crystal display apparatus 50 has the design of the projection and the contact hole, and therefore it also has the same advantageous effects.

Above are embodiments of the present application, which does not limit the scope of the present application. Any modifications, equivalent replacements or improvements within the spirit and principles of the embodiment described above should be covered by the protected scope of the invention.

What is claimed is:

1. A liquid crystal display panel, comprising:
a color filter substrate, and an array substrate, formed opposite and space apart from the color filter substrate, and a photo spacer disposed between the color filter substrate and the array substrate;
a side of the array substrate toward the color filter substrate is set up a contact hole, a side of the color filter substrate toward the array substrate is disposed a projection, the height of the projection is larger than the height of the photo spacer, and the top of the projection is inserted into the contact hole;
wherein the color filter substrate comprises a first substrate body, a color filter layer and an over coat layer, the color filter layer is formed on a side of the first substrate body toward the array substrate, the over coat layer is formed on a side of the color filter layer toward the array substrate, the projection is formed by at least one of the multiple exposure and development in the formation of the color filter layer;
the array substrate comprising a second substrate body and a thin film transistor, a planarization layer and a pixel electrode layer formed on the second substrate body, the pixel electrode layer is formed in the contact hole, and is electrically connected to the drain electrode of the thin film transistor through the contact hole;
wherein the array substrate further comprises a passivation layer, a touch electrode, a dielectric spacer layer, a common electrode, and a data line subsequently formed below the photo spacer and overlap with the photo spacer, and the photo spacer is in contact with the passivation layer; and
wherein a capacitance formed between the touch electrode and the common electrode layer.

2. The liquid crystal display panel according to claim 1, wherein the color filter substrate further comprises a black matrix disposed between the first substrate body and the color filter layer.

3. The liquid crystal display panel according to claim 1, wherein the color filter layer comprises a red color filter, a green color filter and a blue color filter.

4. The liquid crystal display panel according to claim 1, wherein the color filter layer comprises a red color filter, a green color filter, a blue color filter and a white color filter.

5. The liquid crystal display panel according to claim 1, wherein the contact hole is set up in the planarization layer.

6. A liquid crystal display apparatus, comprising a liquid crystal display panel and a light source module for providing light to the liquid crystal display panel, the liquid crystal display panel comprising: a color filter substrate, and an array substrate, formed opposite and space apart from the color filter substrate, and a photo spacer disposed between the color filter substrate and the array substrate;
a side of the array substrate toward the color filter substrate is set up a contact hole, a side of the color filter substrate toward the array substrate is disposed a projection, the height of the projection is larger than the height of the photo spacer, and the top of the projection is inserted into the contact hole;
wherein the color filter substrate comprises a first substrate body, a color filter layer and an over coat layer, the color filter layer is formed on a side of the first substrate body toward the array substrate, the over coat layer is formed on a side of the color filter layer toward the array substrate, the projection is formed by at least one of the multiple exposure and development in the formation of the color filter layer;
the array substrate comprising a second substrate body and a thin film transistor, a planarization layer and a pixel electrode layer formed on the second substrate body, the pixel electrode layer is formed in the contact hole, and is electrically connected to the drain electrode of the thin film transistor through the contact hole;
wherein the array substrate further comprises a passivation layer, a touch electrode, a dielectric spacer layer, a common electrode, and a data line subsequently formed below the photo spacer and overlap with the photo spacer, and the photo spacer is in contact with the passivation layer; and
wherein a capacitance formed between the touch electrode and the common electrode layer.

7. The liquid crystal display apparatus according to claim 6, wherein the color filter substrate further comprises a black matrix disposed between the first substrate body and the color filter layer.

8. The liquid crystal display apparatus according to claim 6, wherein the color filter layer comprises a red color filter, a green color filter and a blue color filter or the color filter layer comprises a red color filter, a green color filter, a blue color filter and a white color filter.

9. The liquid crystal display apparatus according to claim 6, wherein the contact hole is set up in the planarization layer.

* * * * *